US010193287B2

(12) United States Patent
Schaper et al.

(10) Patent No.: US 10,193,287 B2
(45) Date of Patent: Jan. 29, 2019

(54) CONNECTING ADAPTER FOR A CONNECTING TERMINAL ASSEMBLY

(71) Applicant: Phoenix Contact GmbH Co. KG, Blomberg (DE)

(72) Inventors: Elmar Schaper, Lugde (DE); Mathias Schoppe, Furstenberg (DE)

(73) Assignee: Phoenix Contact GmbH Co. KG, Blomberg (DE)

( * ) Notice: Subject to any disclaimer, the term of this patent is extended or adjusted under 35 U.S.C. 154(b) by 0 days.

(21) Appl. No.: 15/532,023

(22) PCT Filed: Nov. 9, 2015

(86) PCT No.: PCT/EP2015/076092
§ 371 (c)(1),
(2) Date: May 31, 2017

(87) PCT Pub. No.: WO2016/087164
PCT Pub. Date: Jun. 9, 2016

(65) Prior Publication Data
US 2017/0271830 A1     Sep. 21, 2017

(30) Foreign Application Priority Data
Dec. 4, 2014 (DE) .......................... 10 2014 117 868

(51) Int. Cl.
*H01R 9/22*     (2006.01)
*H01R 31/06*     (2006.01)
(Continued)

(52) U.S. Cl.
CPC ............... *H01R 31/06* (2013.01); *H01R 9/26* (2013.01); *H05K 1/0245* (2013.01); *H05K 1/117* (2013.01);
(Continued)

(58) Field of Classification Search
CPC ............................... H01R 13/514; H01R 9/24
(Continued)

(56) References Cited

U.S. PATENT DOCUMENTS 4,936,785 A    6/1990   Krug et al.
5,615,079 A    3/1997   Eggert et al.
(Continued)

FOREIGN PATENT DOCUMENTS

CN     102421258 A     4/2012
DE     101 48 470 A1     4/2003
(Continued)

*Primary Examiner* — Phuong Dinh
(74) *Attorney, Agent, or Firm* — Holland & Har LLP

(57) ABSTRACT

The present disclosure relates to a connecting adapter configured to connect to a terminal assembly. The connecting terminal assembly includes a plurality of electrical connecting terminals. The connecting adapter includes a printed circuit board that includes a comb-type conducting structure. The comb-type conducting structure includes a plurality of comb teeth, and each comb tooth includes an electrical contact surface. The connecting adapter also includes an electrical plug connector interface including a plug connector. The electrical plug connector interface includes electrical terminals electrically connected to the electrical contact surfaces of the comb teeth. The electrical plug connector interface is arranged on the printed circuit board.

18 Claims, 18 Drawing Sheets

(51) Int. Cl.
*H01R 9/26* (2006.01)
*H05K 1/11* (2006.01)
*H05K 1/02* (2006.01)
*H05K 1/14* (2006.01)

(52) U.S. Cl.
CPC ....... *H05K 1/144* (2013.01); *H05K 2201/042* (2013.01); *H05K 2201/09172* (2013.01)

(58) Field of Classification Search
USPC .............................................. 439/76.1, 709
See application file for complete search history.

(56) References Cited

U.S. PATENT DOCUMENTS

| | | | |
|---|---|---|---|
| 6,004,139 A | 12/1999 | Dramstad et al. | |
| 8,113,864 B2* | 2/2012 | Chiang .............. | H01R 13/4361 439/347 |
| 2002/0072255 A1 | 6/2002 | Leman | |

FOREIGN PATENT DOCUMENTS

| | | |
|---|---|---|
| DE | 102 51 615 A1 | 5/2004 |
| DE | 10 2006 025 604 A1 | 11/2007 |
| DE | 20 2007 011 112 U1 | 12/2007 |
| EP | 0 709 932 A2 | 5/1996 |
| GB | 2 035 716 A | 6/1980 |
| JP | S50 145462 U | 12/1975 |
| WO | WO 97/40550 A1 | 10/1997 |

* cited by examiner

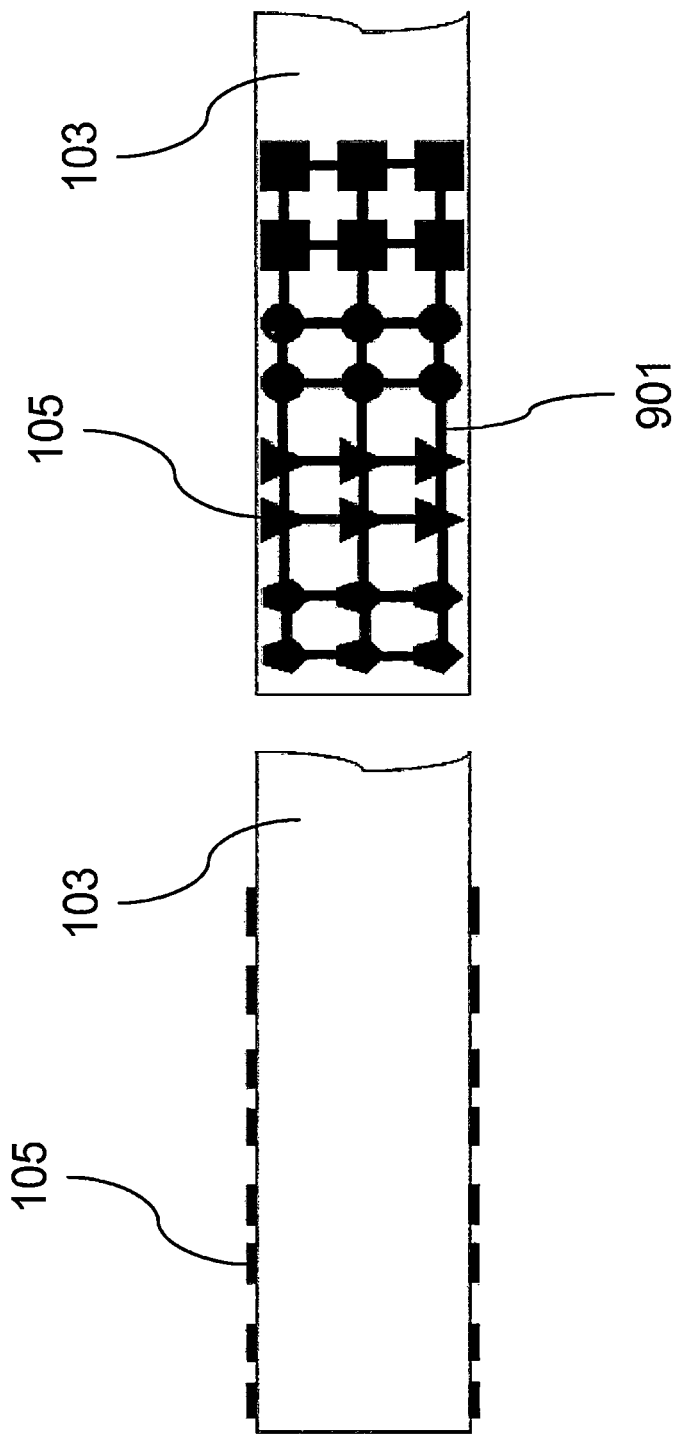

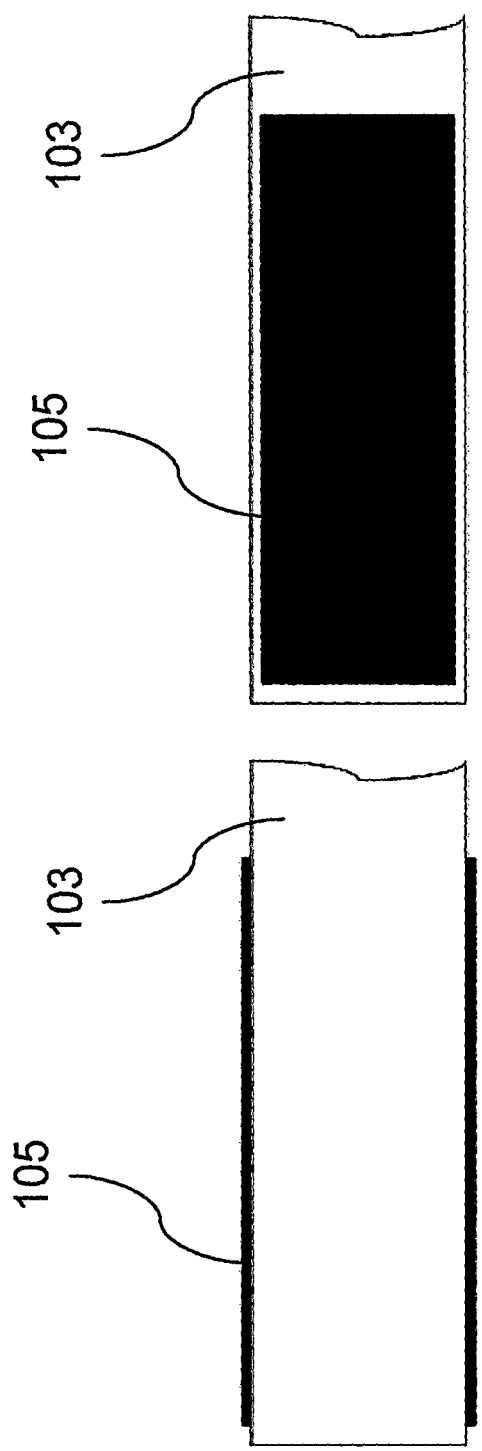

CONNECTING ADAPTER FOR A CONNECTING TERMINAL ASSEMBLY

CROSS-REFERENCE TO RELATED APPLICATIONS

This application is a 371 national phase filing of International Application No. PCT/EP2015/076092, entitled "CONNECTING ADAPTER FOR A CONNECTING TERMINAL ASSEMBLY", filed 9 Nov. 2015, which claims priority to German Patent Application No. 10 2014 117 868.8, entitled "VERBINDUNGSADAPTER FUR EINE ANSCHLUSSKLEMMENANORDNUNG", filed 4 Dec. 2014.

BACKGROUND

The present disclosure relates to a connecting adapter for a connecting terminal assembly.

In process technology, operation of field device such as an actuator or a sensor is frequently controlled by means of a control system. To this end, the field device often comprises a field device interface which is connected to a control system interface of the control system by a connecting cable.

When controlling the operation of a plurality of field devices, the plurality of connecting cables frequently connect the field device interfaces of the field devices to the control system interface of the control system by way of a connecting terminal assembly such as a terminal block assembly. To this end, the leads of the connecting cables are often individually intricately connected electrically and mechanically to electrical connecting terminals, e.g., screw terminals, of the connecting terminal assembly. This can be perceived as inconvenient.

SUMMARY

The task on which the disclosure is based is that of specifying an efficient concept for connecting an electrical device to a connecting terminal assembly.

This task is solved by the subject matter with the features of the independent claim. Advantageous examples of the disclosure constitute the subject matter of the figures, the description and the dependent claims.

The present disclosure is based on the realization that the above task can be solved by a connecting adapter able to be connected to a number of electrical connecting terminals of a connecting terminal assembly and which comprises an electrical plug connector interface. The electrical device such as a field device or a control system can thereby be efficiently connected to the connecting adapter via a prefabricated multi-pole cable having one or more connected plug connectors, for example FLK, D-SUB, ELCO, Fujitusu FCN, IEC 60603 or a so-called system cable of the Mini-Combicon, Combicon or Power Combicon family from Phoenix Contact having the respective typical number of poles, in order to connect the electrical device to the connecting terminal assembly. For example, the system cable has an FLK plug connector with the typical 14, 16, 20, 24, 26, 34, 40, 50, 60 or 64 number of poles, a high density (HD)-type FLK plug connector, a D-Sub plug connector with the typical 9, 15, 25, 37, 50 or 62 number of poles, an HD-type D-Sub plug connector, an ELCO plug connector with the typical 20, 38, 56, 90 or 120 number of poles, a 40-pole Fujitsu FCN plug connector, an IEC 60603 plug connector, a plug connector from the Phoenix Contact (PxC) Mini-Combicon family, the PxC Combicon family or the PxC Power-Combicon family having 2 to 20 poles and/or another PxC plug connector.

According to a first aspect of the disclosure, the task is solved by a connecting adapter for a connecting terminal assembly, wherein the connecting terminal assembly has a number of electrical connecting terminals, comprising: a printed circuit board having a comb-type conducting structure with a number of comb teeth, wherein each comb tooth has a respective electrical contact surface; an electrical plug connector interface for a plug connector, wherein the electrical plug connector interface has electrical terminals which are electrically connected to the electrical contact surfaces of the comb teeth, and wherein the electrical plug connector interface is arranged on the printed circuit board. This thereby achieves the advantage of being able to efficiently and economically connect an electrical device such as a field device, a system control or control technology to the connecting terminal assembly by means of a system cable which is connectable to the electrical plug connector interface.

The connecting terminal assembly can be a terminal block assembly, in particular a terminal block assembly arranged in a control cabinet. Furthermore, the number can be 1, 2, 3, 4, 5, 6, 7, 8, 9, 10, 15, 20, 25, 30, 35, 40, 45 or 50. In accordance with one example, the number can be one corresponding to the number of plug connectors utilized or a random number of poles. The electrical connecting terminals can be formed by screw terminals. Screwing in the screw terminals can thereby further achieve mechanically fixing the connecting adapter on the connecting terminal assembly.

The comb-type conducting structure can be formed by conductive paths on the printed circuit board. Furthermore, each of the electrical contact surfaces can be formed by a copper layer. For example, each comb tooth is coated with copper on one side, on two sides or on all sides.

The electrical plug connector interface can comprise an interface for connecting to an FLK plug connector, an HD-type FLK plug connector, a D-Sub plug connector, an HD-type D-Sub plug connector, an ELCO plug connector, a Fujitsu FCN plug connector, an IEC 60603 plug connector, a plug connector of the PxC Mini-Combicon family, the PxC Combicon family or the PxC Power-Combicon family and/or another PxC plug connector.

In one advantageous example of the connecting adapter, a respective electrical contact surface of a comb tooth of the printed circuit board is in each case electrically connected to an electrical terminal of the electrical plug connector interface. This thereby achieves the advantage of electrical signals being able to be transmitted from an electrical terminal of the electrical plug connector interface to an electrical contact surface of a comb tooth and thus to the electrical connecting terminal into which the comb tooth is inserted. For example, each electrical terminal of the electrical plug connector interface is electrically connected to exactly one electrical contact surface of a comb tooth.

In a further advantageous example of the connecting adapter, the connecting adapter is designed with a plug connector, in particular an FLK plug connector or a D-Sub plug connector, wherein the plug connector is electrically connected to the electrical terminals of the electrical plug connector terminal. This thereby achieves the advantage of being able to efficiently connect a system cable to the connecting adapter. The electrical plug connector can be materially bonded to the printed circuit board, in particular by being soldered to the electrical terminals of the electrical plug connector terminal.

Furthermore, the plug connector can be an HID-type FLK plug connector, an HD-type D-Sub plug connector, an ELCO plug connector, a Fujitsu FCN plug connector, an IEC 60603 plug connector, a plug connector of the PxC Mini-Combicon family, the PxC Combicon family or the PxC Power-Combicon family or another PxC plug connector.

In a further advantageous example of the connecting adapter, the plug connector is non-positively or positively connected to the printed circuit board. This thereby achieves the advantage of the plug connector being able to be fixed to the printed circuit board. The plug connector can be screwed or locked onto the printed circuit board. To this end, the printed circuit board can have an opening for a screw to pass through and/or a locking hole.

In a further advantageous example of the connecting adapter, the comb teeth of the printed circuit board are rectangular or rounded. This thereby achieves the advantage of very easy insertion of the comb teeth into the electrical connecting terminals.

In a further advantageous example of the connecting adapter, adjacent comb teeth of the printed circuit board are spaced apart by means of a recess, in particular by a rectangular or rounded recess which is designed to receive a housing crosspiece of the connecting terminal assembly between adjacent electrical connecting terminals. This thereby achieves the advantage of the comb teeth being able to be positively received in the electrical connecting terminals of the connecting terminal assembly.

In a further advantageous example of the connecting adapter, an electrical contact surface of a comb tooth of the plurality of comb teeth of the printed circuit board is of rectangular, square, circular, triangular or pentagonal shape. This thereby achieves the advantage of being able to optimize the electrical contact of the electrical contact surface with a clamping body or a clamping surface of an electrical connecting terminal.

In a further advantageous example of the connecting adapter, a comb tooth exhibits a number of electrical contact surfaces connected together electroconductively by means of electroconductive bars, in particular by copper bars arranged on the printed circuit board. This thereby achieves the advantage of being able to further optimize electrical contact between the electrical contact surface and a clamping body or a clamping surface of an electrical connecting terminal. For example, the number amounts to 2, 3, 4, 5, 6, 7, 8, 9, 10, 15, 20, 24, 25, 30, 35, 40, 45 or 50. According to one example, the number can be one corresponding to the number of plug connectors utilized or a random number of poles. Furthermore, an electrical contact surface of the plurality of electrical contact surfaces can be of rectangular, square, circular, triangular or pentagonal shape.

In a further advantageous example of the connecting adapter, the connecting adapter is designed with an electrical signal transmission interface, in particular an electrical signal transmission interface formed in or on the printed circuit board, wherein the electrical signal transmission interface is electrically connected to the electrical plug connector interface. This thereby achieves the advantage of the connecting adapter being able to be connected to a further electrical device, in particular to a further connecting adapter.

According to one example, the electrical signal transmission interface can comprise a number of electrical terminals formed by breakdown contacts in the printed circuit board. The number for example amounts to 1, 2, 3, 4, 5, 6, 7, 8, 9, 10, 15, 20, 25, 30, 35, 40, 45 or 50. According to one example, the number can be one corresponding to the number of plug connectors utilized or a random number of poles.

According to a further example, the electrical signal transmission interface can comprise a number of electrical terminals formed by electrical contact surfaces on the printed circuit board, particularly at an edge thereof. The number for example amounts to 1, 2, 3, 4, 5, 6, 7, 8, 9, 10, 15, 20, 25, 30, 35, 40, 45 or 50. According to one example, the number can be one corresponding to the number of plug connectors utilized or a random number of poles.

In a further advantageous example of the connecting adapter, the connecting adapter is configured with: a further printed circuit board having a comb-type conducting structure with a number of comb teeth, wherein each comb tooth has a respective electrical contact surface; and a further electrical signal transmission interface, in particular a further electrical signal transmission interface formed in or on the further printed circuit board, wherein the further electrical signal transmission interface is electrically connected to the electrical signal transmission interface of the printed circuit board and to the electrical contact surfaces of the further printed circuit board's comb teeth. This thereby achieves the advantage of the electrical device being able to be connected to a multi-level connecting terminal assembly, in particular to a double-level terminal block, by means of the connecting adapter. The comb teeth of the further printed circuit board and their electrical contact surfaces can thereby be configured as with the printed circuit board. Furthermore, the further electrical signal transmission interface can be designed like the electrical signal transmission interface.

In a further advantageous example of the connecting adapter, the further signal transmission interface is electrically connected to the electrical signal transmission interface by a sandwich strip or a flexible portion of the printed circuit board, in particular a curved or S-shaped flexible printed circuit board portion. This thereby achieves the advantage of being able to manufacture the connecting adapter particularly economically.

The sandwich strip can have a number of contact pins. The number amounts for example to 2, 3, 4, 5, 6, 7, 8, 9, 10, 15, 20, 25, 30, 35, 40, 45 or 50. In accordance with one example, the number can be one corresponding to the number of plug connectors utilized or a random number of poles. Furthermore, the flexible portion of the printed circuit board can incorporate a Starflex printed circuit board and/or a polyamide printed circuit board. The printed circuit board and the flexible portion of the printed circuit board are for example laminated or press-lit.

In a further advantageous example of the connecting adapter, a respective electrical contact surface of a comb tooth of the further printed circuit board is in each case electrically connected to a respective electrical terminal of the electrical plug connector interface. This thereby achieves the advantage of electrical signals being able to be transmitted from an electrical terminal of the electrical plug connector interface to an electrical contact surface of a comb tooth and thus to the electrical connecting terminal into which the comb tooth is inserted. For example, each electrical terminal of the electrical plug connector interface is electrically connected to exactly one electrical contact surface of a comb tooth.

In a further advantageous example of the connecting adapter, the printed circuit board and the further printed circuit board are arranged one above the other and at a spacing from one another. This thereby achieves the advantage of the connecting adapter being able to be connected to a connecting terminal assembly having stacked rows of electrical connecting terminals.

In a further advantageous example of the connecting adapter, the printed circuit board and the further printed circuit board are arranged at a spacing from one another by means of a spacer pin. This thereby achieves the advantage of being able to increase the connecting adapter's mechanical strength. The spacer pin can be a plastic pin. Furthermore, the spacer pin can be screwed onto the printed circuit board and/or the further printed circuit board.

In a further advantageous example of the connecting adapter, the connecting adapter is designed with: a further number of further printed circuit boards, wherein each printed circuit board has a comb-type conducting structure having a number of comb teeth, each having an electrical contact surface as well as an electrical signal transmission interface, and wherein the electrical contact surfaces of at least one printed circuit board of the further number of further printed circuit boards are connected to the electrical signal transmission interface of said printed circuit board. This thereby achieves the advantage of the connecting adapter being able to be connected to a multi-level connecting terminal assembly, in particular to a multi-level terminal block.

The comb teeth of the further number of the further printed circuit boards and their electrical contact surfaces can be designed as with the printed circuit board. The further number can furthermore amount to 1, 2, 3, 4, 5, 6, 7, 8, 9 or 10. According to one example, the further number can be one corresponding to the number of plug connectors utilized or a random number of poles. The number of comb teeth can furthermore amount to 2, 3, 4, 5, 6, 7, 8, 9, 10, 15, 20, 25, 30, 35, 40, 45 or 50. According to one example, the number can be one corresponding to the number of plug connectors utilized or a random number of poles. Furthermore, the further electrical signal transmission interfaces can be designed like the electrical signal transmission interface.

The electrical signal interfaces of adjacent printed circuit boards can be electrically connected, in particular by means of a sandwich strip or a flexible printed circuit board section, so as to electrically connect the electrical contact surfaces to the electrical terminals of the electrical plug connector interface. Furthermore, adjacent printed circuit boards of the further number of further printed circuit boards can be arranged one above the other and at a spacing from one another, in particular by means of a spacer pin.

In a further advantageous example of the connecting adapter, a respective electrical contact surface of a comb tooth of the further number of the further printed circuit boards is in each case electrically connected to a respective electrical terminal of the electrical plug connector interface. This thereby achieves the advantage of electrical signals being able to be transmitted from an electrical terminal of the electrical plug connector interface to an electrical contact surface of a comb tooth and thus to the electrical connecting terminal into which the comb tooth is inserted. For example, each electrical terminal of the electrical plug connector interface is electrically connected to exactly one electrical contact surface of a comb tooth.

BRIEF DESCRIPTION OF THE DRAWINGS

Examples of the principles of this disclosure are depicted in the drawings and will be described in greater detail below.

FIGS. 8A, 8B, 9A, 9B, 10A, and 10B illustrate various examples of an electrical contact surface of a comb tooth;

DETAILED DESCRIPTION

Figure 1:
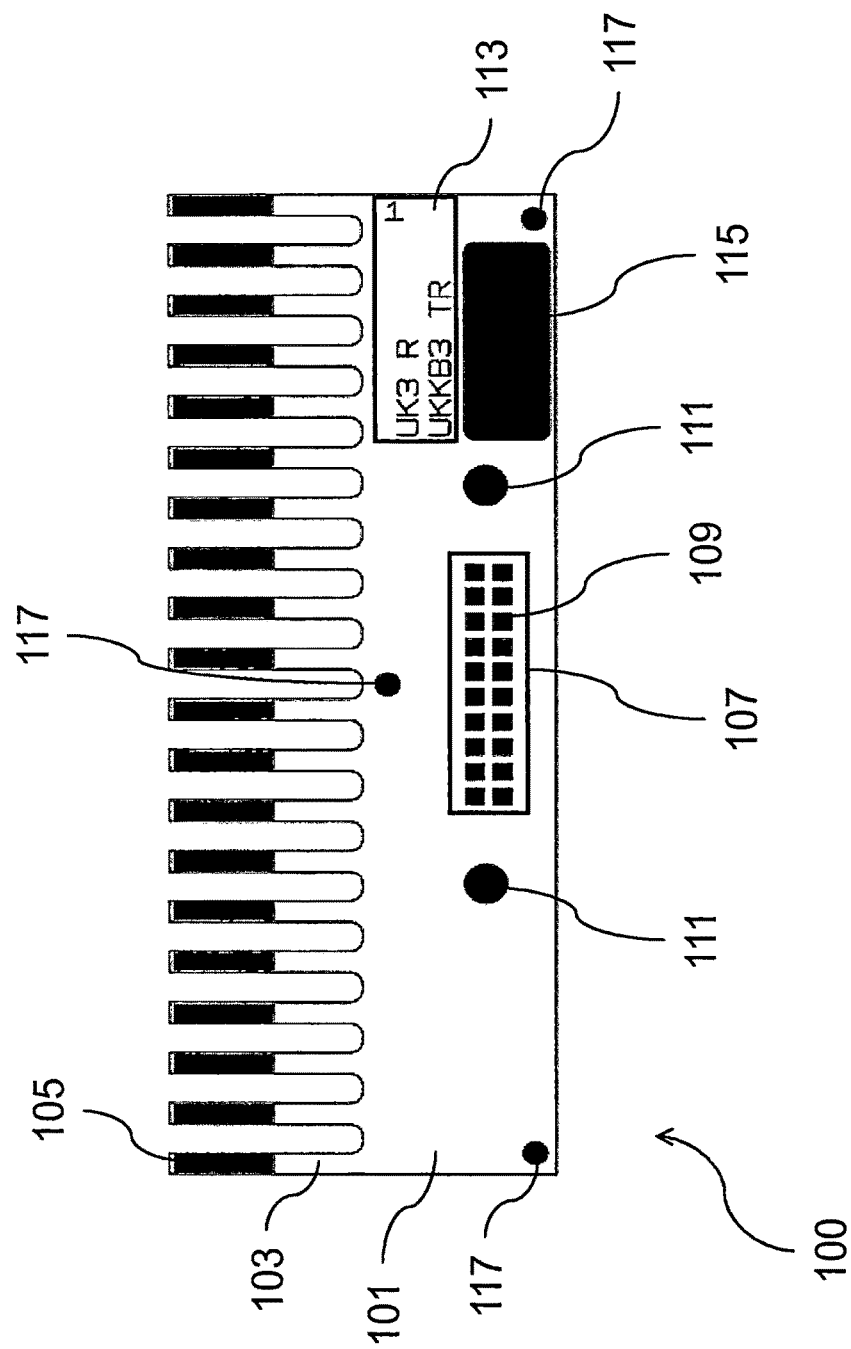
FIG. 1 is a schematic representation of a connecting adapter according to one example.

FIG. 1 shows a schematic representation of a connecting adapter 100 according to one example. The connecting adapter 100 comprises a printed circuit board 101 having twenty comb teeth 103, each having a respective electrical contact surface 105, an electrical plug connector interface 107 comprising twenty electrical terminals 109, two openings 111 by means of which a plug connector can be non-positively or positively connected to the printed circuit board 101, a labeling field 113, an identification field 115 and three drill holes 117.

The connecting adapter 100 for a connecting terminal assembly, wherein the connecting terminal assembly comprises a number of electrical connecting terminals, can be configured, comprising: the printed circuit board 101 comprising a comb-type conducting structure comprising the number of comb teeth 103, wherein each comb tooth 103 has a respective electrical contact surface 105; the electrical plug connector interface 107 for a plug connector, wherein the electrical plug connector interface 107 comprises electrical terminals 109 which are electrically connected to the electrical contact surfaces 105 of the comb teeth 103, and wherein the electrical plug connector interface 107 is arranged on the printed circuit board 101.

The connecting terminal assembly can be a terminal block assembly, in particular a terminal block assembly arranged in a control cabinet. Furthermore, the number can be 1, 2, 3, 4, 5, 6, 7, 8, 9, 10, 15, 20, 25, 30, 35, 40, 45 or 50. In accordance with one example, the number can be one corresponding to the number of plug connectors utilized or a random number of poles. The electrical connecting terminals can be formed by screw terminals. Screwing in the screw terminals can thereby further achieve mechanically fixing the connecting adapter 100 on the connecting terminal assembly.

The comb-type conducting structure can be formed by conductive paths on the printed circuit board 101. Furthermore, each of the electrical contact surfaces 105 can be formed by a copper layer. For example, each comb tooth 103 is coated with copper on one side, on two sides or on all sides.

The electrical plug connector interface 107 can comprise an interface for connecting to an FLK plug connector, an HD-type FLK plug connector, a D-Sub plug connector, an HD-type D-Sub plug connector, an ELCO plug connector, a Fujitsu FCN plug connector, an IEC 60603 plug connector, a plug connector of the PxC Mini-Combicon family, the PxC Combicon family or the PxC Power-Combicon family and/or another PxC plug connector.

According to one example, the printed circuit board 101 can be an FR4 printed circuit board.

According to a further example, different, ideally universal and/or specially designed, in particular system cable-dependent, printed circuit boards 101 for differing numbers of poles, for example adapted to the pattern of the connecting terminal assembly, can be used in the establishing of contact with a control side of a connecting terminal assembly such as a terminal block. This thereby enables a quicker and non-transposable connecting of electrical equipment such as a control device to the connecting terminal assembly.

According to a further example, the comb teeth 103 of the printed circuit board 101 can be configured somewhat more narrow than the terminal compartments of the electrical connecting terminals so as to be able to compensate for small pattern deviations in the connecting terminal assembly.

According to a further example, each electrical connecting terminal can comprise a respective clamping body which can be pressed against a comb tooth 103 in order to mechanically fix the comb tooth 103 on the electrical connecting terminal and so as to establish the electrical contact with the electrical contact surface 105 of the comb tooth 103, for example via a clamping surface. The clamping body is made for example from galvanized steel.

According to a further example, a number of connecting adapters 100 can be connected to the connecting terminal assembly. To this end, the connecting adapters 100 of the plurality of connecting adapters 100 can be implemented in various configurations as in variants in order to facilitate connection to the connecting terminal assembly. This can be advantageous particularly in the case of a multi-level connecting terminal assembly. The comb teeth 105 can thereby be staggered in the various adaptations of the connecting adapter 100 so as to enable a tool such a screwdriver to be able to access a level of a multi-level connecting terminal assembly. Furthermore, the different adaptations of the connecting adapter 100 can be designated as left, right, upper, center, lower as well as all resultant combinations. To better identify: the respectively employed adaptation of the connecting adapter 100, the associated designation such as a terminal block designation can be indicated in the labeling field 113 on the printed circuit board 101. Furthermore, an indication of left and right adaptation can be made in identification field 115, for example by using different colors.

Figure 2:
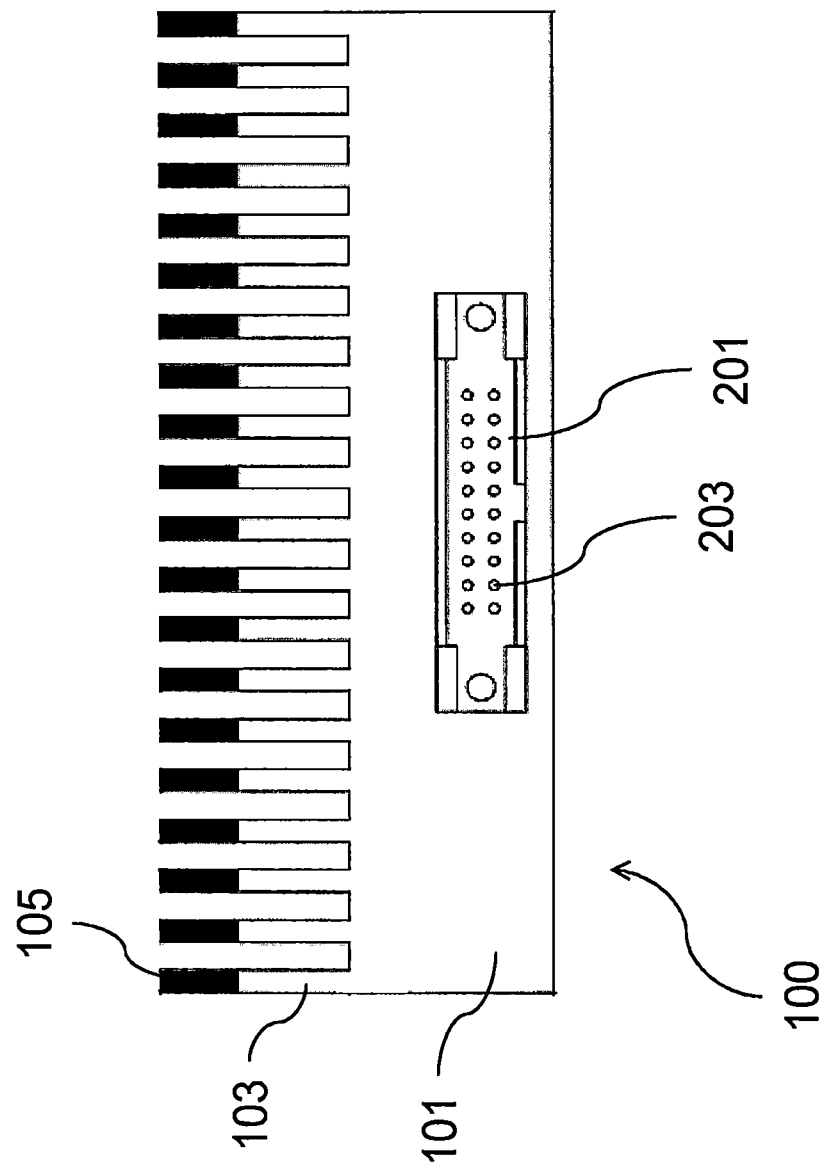
FIG. 2 is a schematic representation of the connecting adapter according to a further example.

FIG. 2 shows a schematic representation of the connecting adapter 100 according to a further example. The connecting adapter 100 comprises the printed circuit board 101 having twenty comb teeth 103, each with a respective electrical contact surface 105, and a plug connector 201 comprising twenty electrical terminals 203 and connected to the not shown electrical plug connector interface 107.

The plug connector 201 can be designed as an FLK plug connector or as a system plug connector. Furthermore, a width of the comb teeth 103 can be 2 mm and a distance between two adjacent comb teeth 103 can be 3 mm. A length of the comb teeth 103 can furthermore amount to 18 mm. A width of the printed circuit board 101 can further amount to 105 mm. Furthermore, a height of the printed circuit board 101 without the comb teeth 103 can amount to 20 mm.

According to one example, contact spacing of the comb teeth can be selected subject to the terminal blocks to be adapted. The spacing can be realized at all conceivable distances, particularly at a minimum tooth width of 1 mm and/or a minimum distance between adjacent teeth of 1 mm, and tooth widths.

Figure 3:
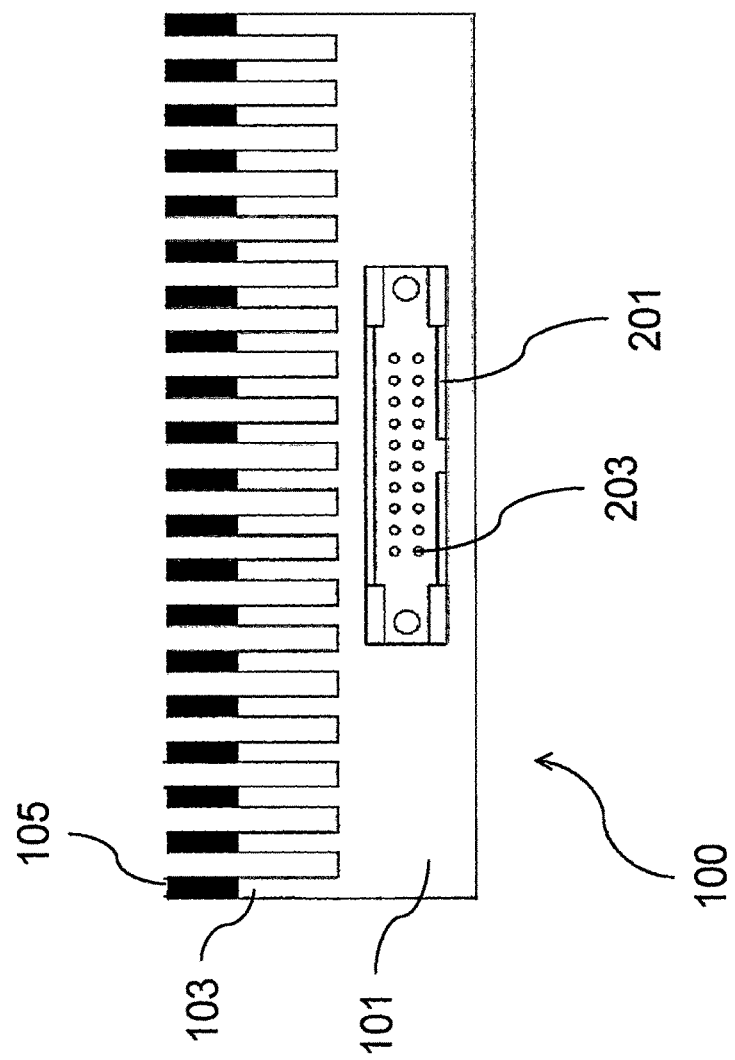
FIG. 3 is a schematic representation of the connecting adapter according to a further example.

FIG. 3 shows a schematic representation of the connecting adapter 100 according to a further example. The connecting adapter 100 illustrated in FIG. 3 only differs from the connecting adapter 100 illustrated in FIG. 2 in the height of the printed circuit board 101 without comb teeth 103. This can amount to 15 mm in the connecting adapter 100 illustrated in FIG. 3.

Figure 4:
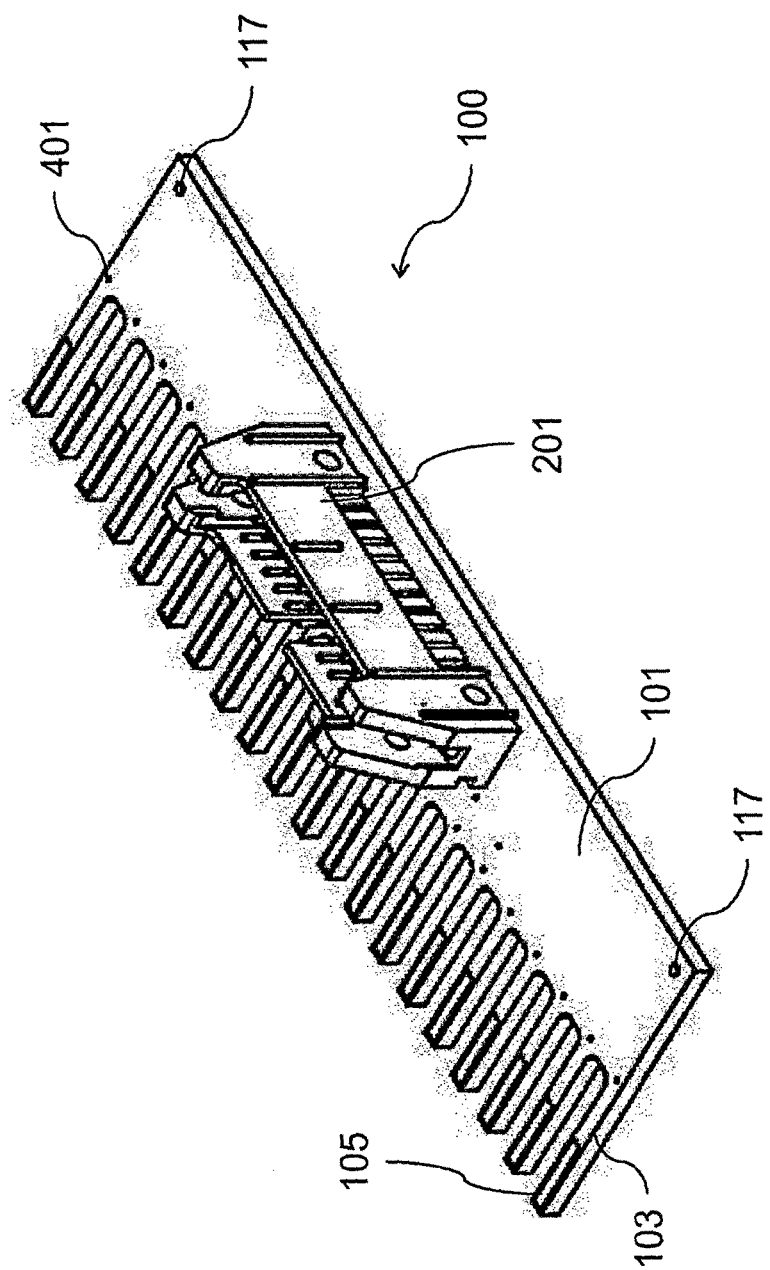
FIG. 4 is a perspective view of the connecting adapter according to a further example.

FIG. 4 shows a perspective view of the connecting adapter 100 according to a further example. The connecting adapter 100 comprises the printed circuit board 101 with twenty comb teeth 103, each having a respective electrical contact surface 105, and the plug connector 201. The printed circuit board 101 further exhibits the two drill holes 117 and a number of drill holes 401. The drill holes 401 can for example enable realizing a through-connection for not shown conductive paths through a layer of the printed circuit board 101.

Figure 5:
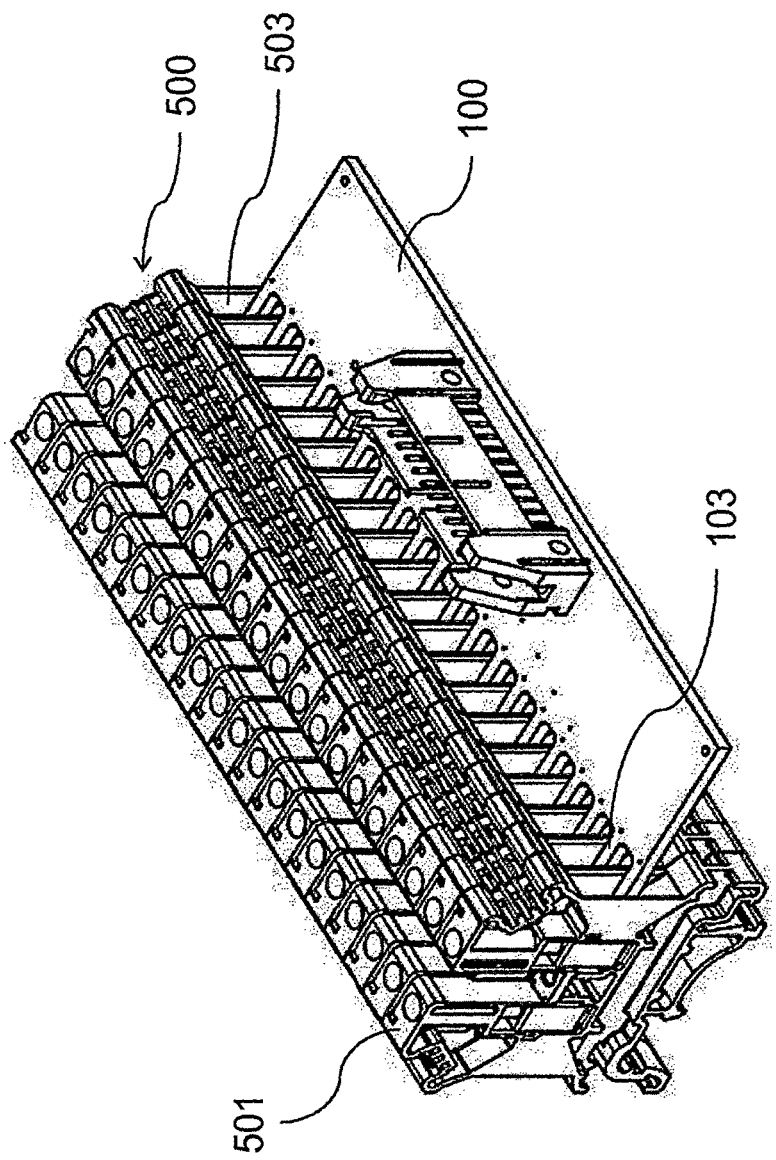
FIG. 5 is an arrangement comprising the connecting adapter shown in FIG. 4 and a connecting terminal assembly.

FIG. 5 shows an arrangement comprising the connecting adapter 100 depicted in FIG. 4 and a connecting terminal assembly 500. The connecting terminal assembly 500 comprises twenty terminal blocks 501 arranged in a row, each having a respective electrical connecting terminal 503 on both sides. The comb teeth 103 of the connecting adapter 100 are inserted into the electrical connecting terminals 501.

Figure 6:
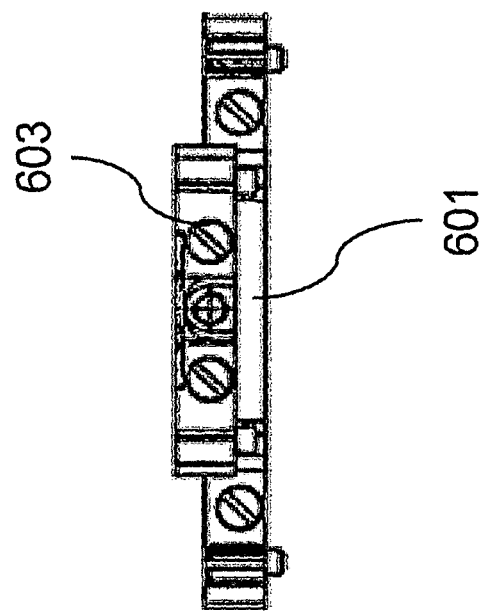
FIG. 6 is a top view of a double-level terminal block.

FIG. 6 shows a top view of a double-level terminal block 601. The double-level terminal block 601 is designed as a screw terminal and incorporates four screws 603. Tightening the screws 603 can mechanically fix a not shown comb tooth 103 inserted into the associated not shown electrical connecting terminal 503 to said electrical connecting terminal 503 and electrically connect the electrical contact surface 105 of the comb tooth 103 to the electrical connecting terminal 503.

Figure 7:
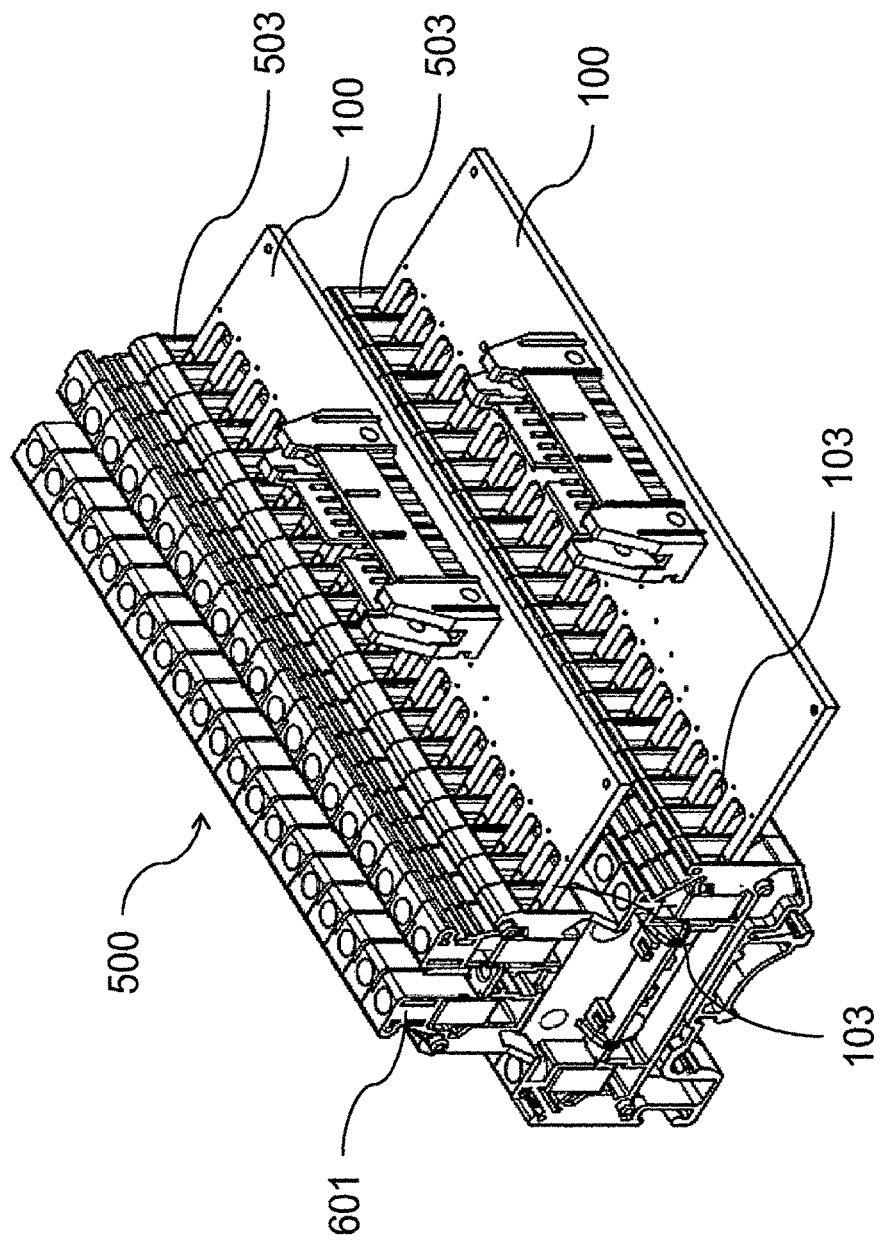
FIG. 7 is an arrangement comprising two of the connecting adapters shown in FIG. 4 and a connecting terminal assembly.

FIG. 7 shows an arrangement having two of the connecting adapters 100 shown in FIG. 4 and a connecting terminal assembly 500. The connecting terminal assembly 500 comprises twenty double-level terminal blocks 601, each respectively exhibiting two electrical connecting terminals 503 on both sides. The comb teeth 103 of the connecting adapter 100 are inserted into the electrical connecting terminals 503.

Figure 8A:
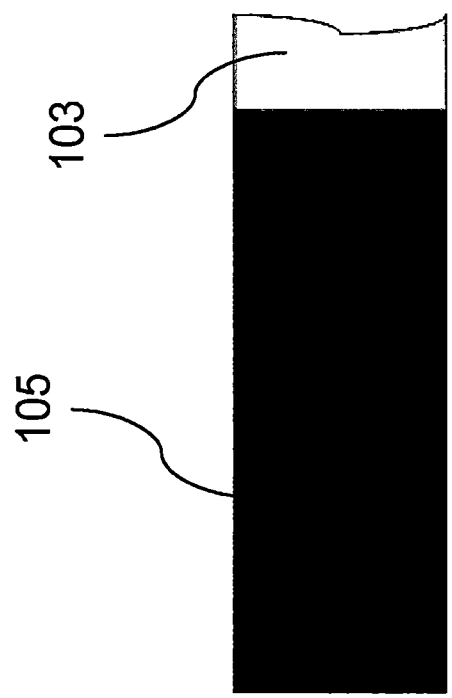
Figure 8B:
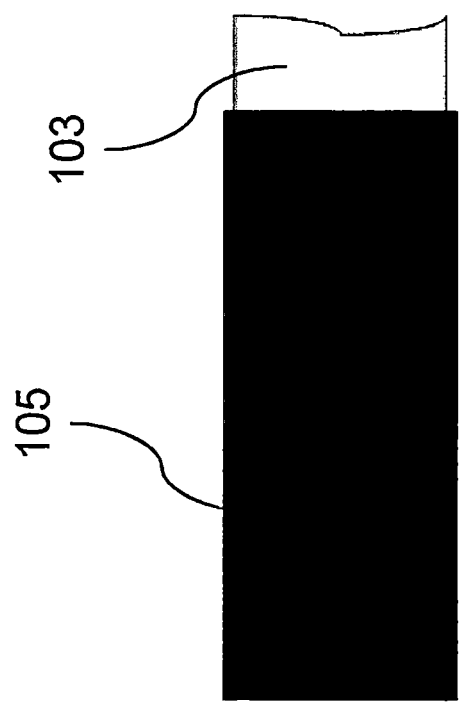

FIGS. 8A, 8B, 9A, 9B, 10A, and 10B show various examples of an electrical contact surface 105 of a comb tooth 103. FIG. 8A shows a side view of a comb tooth 103, whose electrical contact surface 105 is formed by a full-surface four-sided copper coating of the comb tooth 103. The copper coating can be 35 μm to 105 μm thick. Furthermore, the comb tooth 103 can have a thickness of 1.5 mm or greater. FIG. 8B shows a view of the comb tooth 103 depicted in FIG. 8A.

FIG. 9A shows a side view of a comb tooth 103 having a number of electrical contact surfaces 105 arranged on an upper side and a lower side of the comb tooth 103. The plurality of electrical contact surfaces 105 can be formed by a copper coating having a thickness of 35 μm to 105 μm. Furthermore, the comb tooth 103 can have a thickness of 1.5 mm or greater. FIG. 9B shows a top view of the comb tooth 103 depicted in FIG. 9A. The electrical contact surfaces 105 of the plurality of electrical contact surfaces 105 are connected by means of electroconductive bars 901 and exhibit different geometric shapes. The geometric shapes are square, circular, triangular and pentagonal. The contacting of the electrical connecting terminals 503 can be optimized by the selection of the geometrical shape, in particular given corrosion or the formation of oxide layers.

FIG. 10A shows a side view of a comb tooth 103, whose electrical contact surface 105 is formed by a double-sided copper coating of the comb tooth 103. The copper coating can be 35 μm to 105 μm thick. Furthermore, the comb tooth 103 can have a thickness of 1.5 mm or greater. FIG. 10B shows a top view of the comb tooth 103 depicted in FIG. 10A. According to one example, the electrical contact surface 105 can extend over the entire width of the comb tooth 103. For example, the electrical contact surface 105 extends to the edges of the comb tooth 103.

Figure 11B:
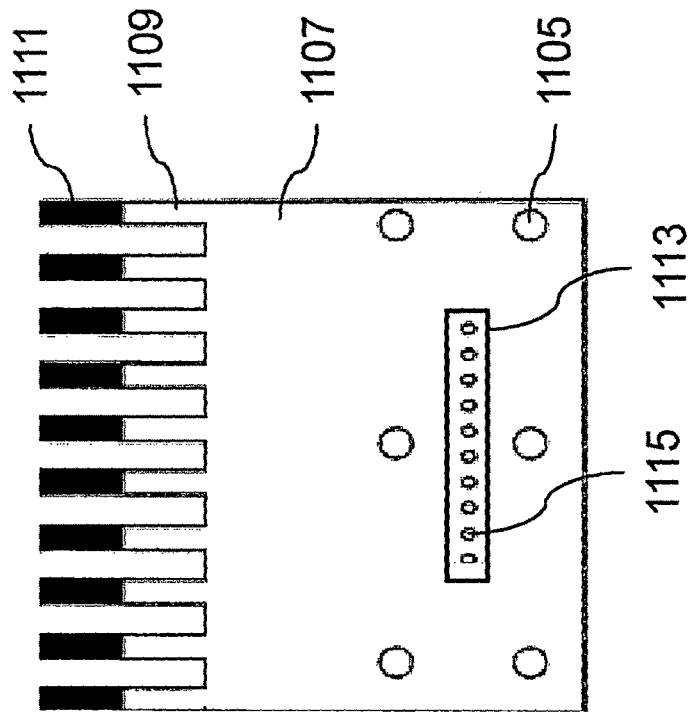
FIG. 11B is a top view of a further printed circuit board according to one example.
Figure 11A:
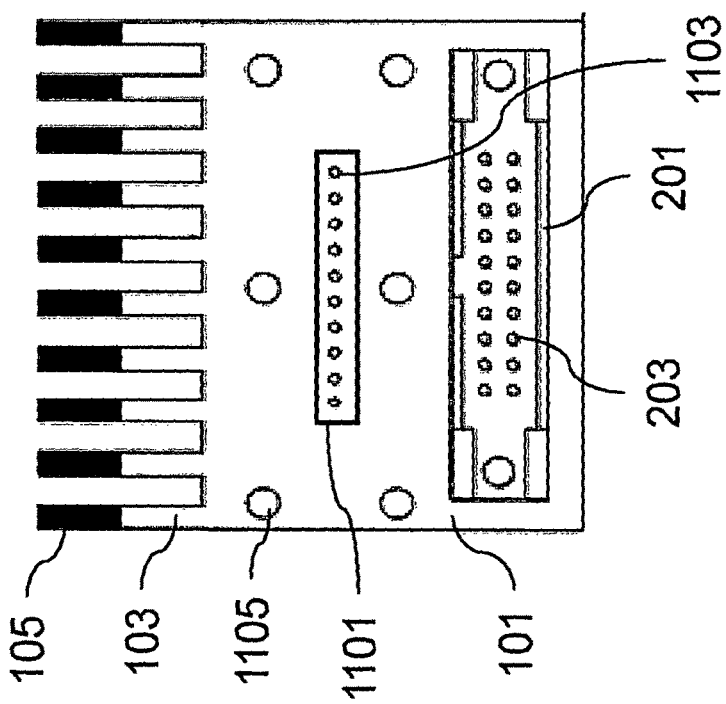
FIG. 11A is a top view of the printed circuit board according to one example.

FIG. 11A shows a top view of the printed circuit board 101 according to one example. The printed circuit board 101 comprises ten comb teeth 103, each having a respective electrical contact surface 105, an electrical signal transmission interface 1101 comprising ten electrical terminals 1103 and six openings 1105 for fixing a spacer pin. The plug connector 201 with twenty electrical terminals 203 is furthermore arranged on the printed circuit board 101. The electrical terminals 1103 can be formed by printed circuit board 101 through-connections.

According to one example, the printed circuit board 101 can further comprise 2, 4, 6, 8 or 10 openings 1105 which can be formed by drill holes.

The connecting adapter 100 can be designed with the electrical signal transmission interface 1101, in particular an electrical signal transmission interface 1101 formed in or on the printed circuit board 101, wherein the electrical signal transmission interface 1101 is electrically connected to the electrical plug connector interface 107.

FIG. 11B shows a top view of a further printed circuit board 101 according to one example. The further printed circuit board 1107 comprises ten comb teeth 1109, each having a respective electrical contact surface 1111, an electrical signal transmission interface 1113 comprising ten electrical terminals 1115 and six openings 1105 for fixing a spacer pin. The electrical terminals 1115 can be formed by through-connections of the further printed circuit board 1107.

According to one example, the further printed circuit board 1107 can further comprise 2, 4, 6, 8 or 10 openings 1105 formed by drill holes.

The connecting adapter 100 can be configured, comprising: the further printed circuit board 1107 with a comb-type conducting structure having a plurality of comb teeth 1109, wherein the comb teeth 1109 each have a respective electrical contact surface 1111; and a further electrical signal transmission interface 1113, in particular a further electrical signal transmission interface 1113 formed in or on the further printed circuit board 1107, wherein the further electrical signal transmission interface 1113 is electrically connected to the electrical signal transmission interface 1101 of the printed circuit board 101 and to the electrical contact surfaces 1111 of the comb teeth 1109 of the further printed circuit board 1107.

According to one example, the electrical terminals 1103 can be electrically connected to electrical terminals 1115 by means of a connecting cable, in particular by a solderable cable connection of differing numbers of poles or by a sandwich strip. The electrical terminals 203 of the plug connector 201 arranged on the printed circuit board 101 can thereby be electrically connected to the electrical contact surfaces 1111 of the further printed circuit board 1107. For example, the upper row of the electrical terminals 203, which can comprise a pin 1, is electrically connected to electrical contact surfaces 1111 and the lower row of the electrical terminals 203, which can comprise a pin 2, is electrically connected to electrical contact surfaces 105.

Figure 12:
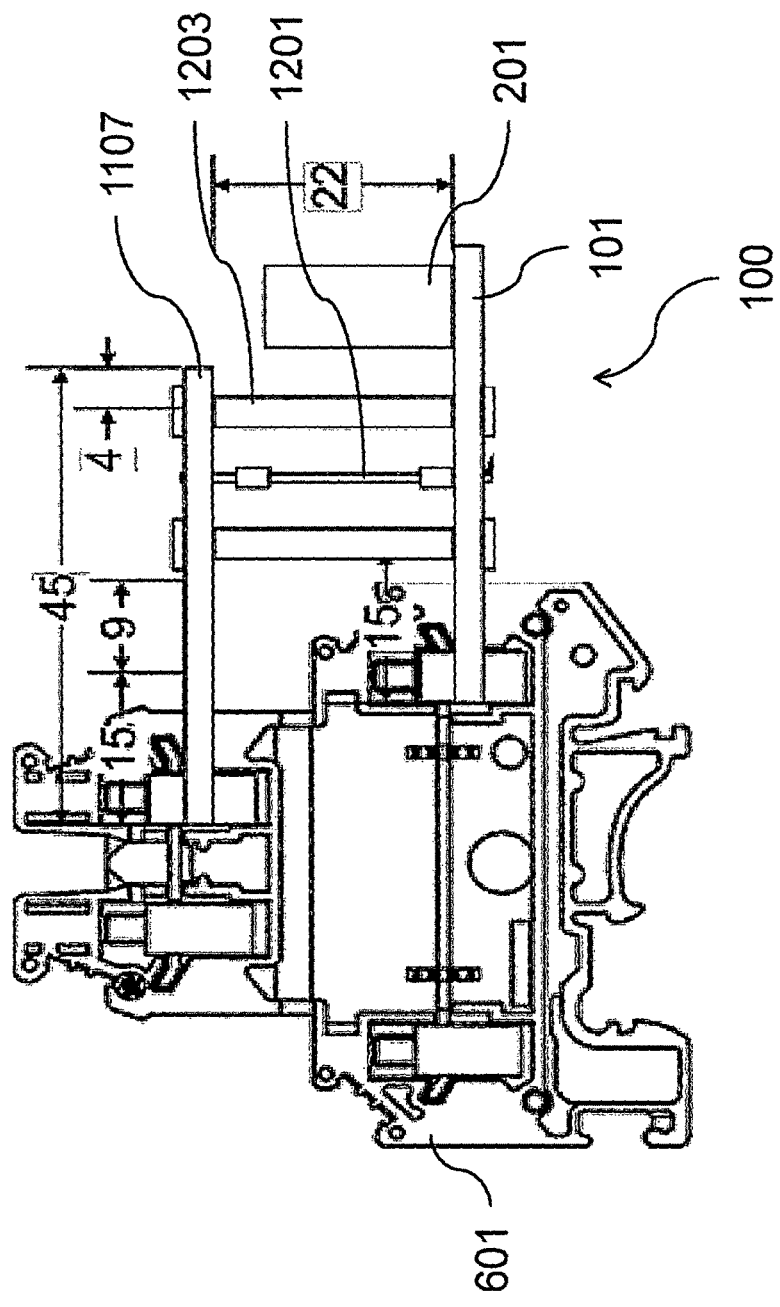
FIG. 12 is a cross-sectional view of an arrangement comprising a number of double-level terminal blocks and the connecting adapter according to a further example.

FIG. 12 shows a cross-sectional view of an arrangement having a number of double-level terminal blocks 601 and the connecting adapter 100 according to a further example. The connecting adapter 100 comprises the printed circuit board 101 comprising the not shown electrical signal transmission interface 1101, the further printed circuit board 1107 comprising the not shown further electrical signal transmission interface 1113, a sandwich strip 1201, which electrically connects the electrical signal transmission interface 1101 and the further electrical signal transmission interface 1113, and spacer pins 1203, which mechanically connect printed circuit board 101 to the further printed circuit board 1107. Dimensions and sizes are furthermore indicated in millimeter units.

The sandwich strip 1201 can comprise a number of contact pins. Furthermore, the contact pins of the sandwich strip 1201 can be soldered to the not shown electrical terminals 1103, 1115. Furthermore, the spacer pins 1203 can be plastic pins. Each spacer pin 1203 can further be respectively screwed onto the printed circuit board 101 and the further printed circuit board 1107. For example, screws are guided through the not shown openings 1105 for this purpose.

Figure 13:
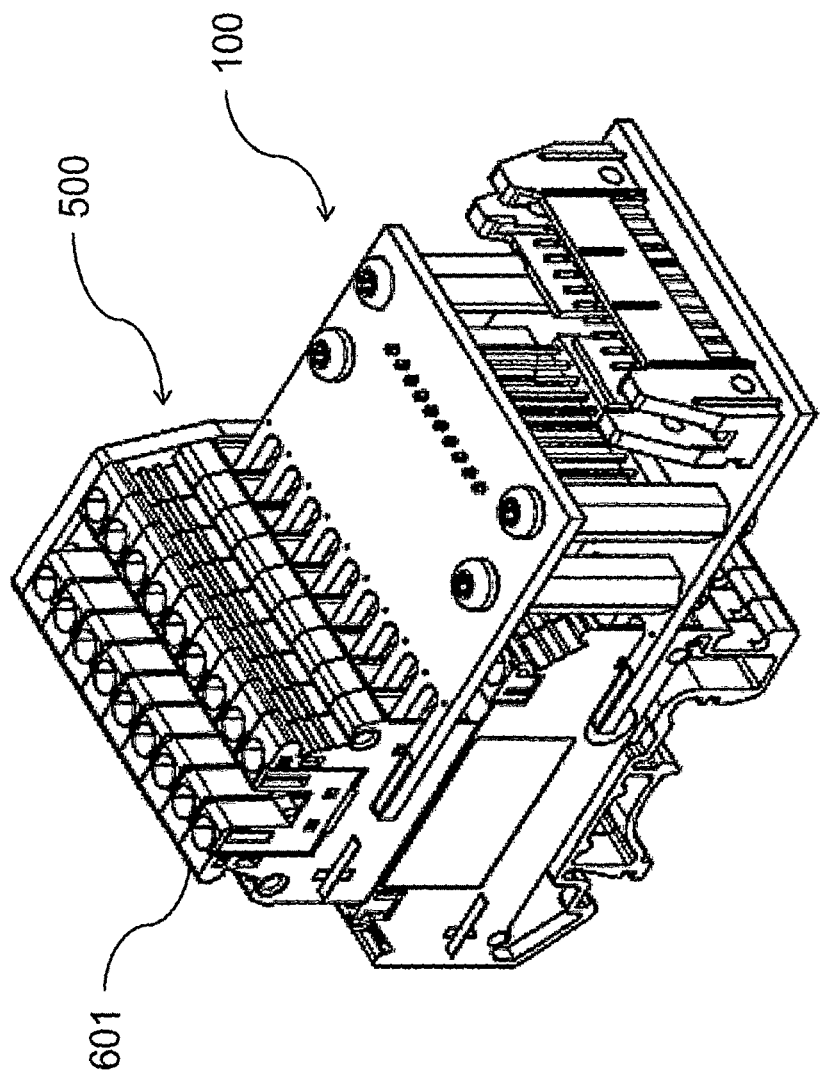
FIG. 13 is a perspective view of the arrangement shown in FIG. 12.
Figure 14:
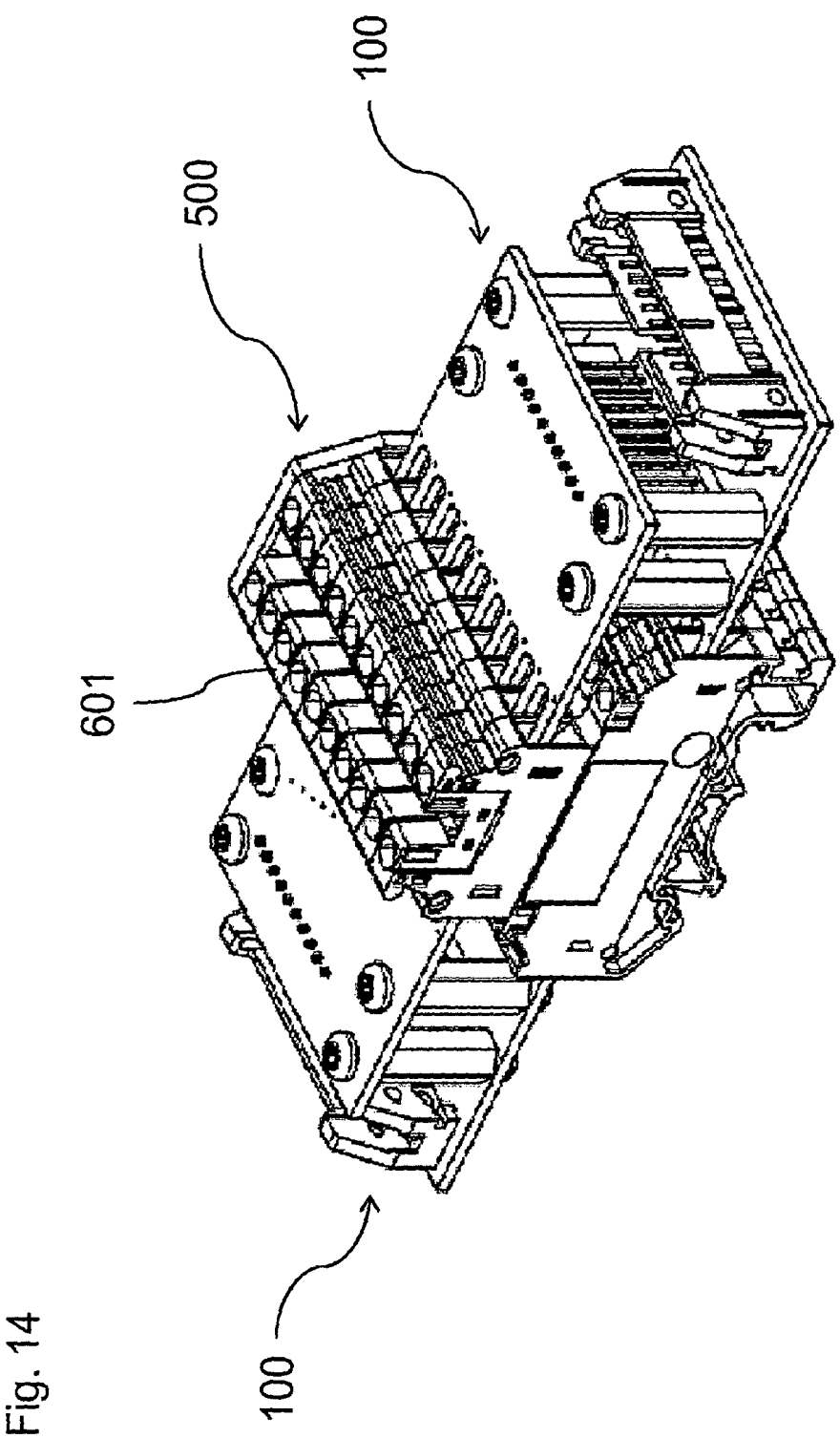
FIG. 14 is a perspective view of the arrangement shown in FIG. 12 having a further connecting adapter.

FIG. 13 shows a perspective view of the arrangement shown in FIG. 12. The connecting terminal assembly 500 is formed by an arrangement of double-level terminal blocks 601. Furthermore, FIG. 14 shows a perspective view of the assembly shown in FIG. 12 comprising a further connecting adapter 100.

Figure 15:
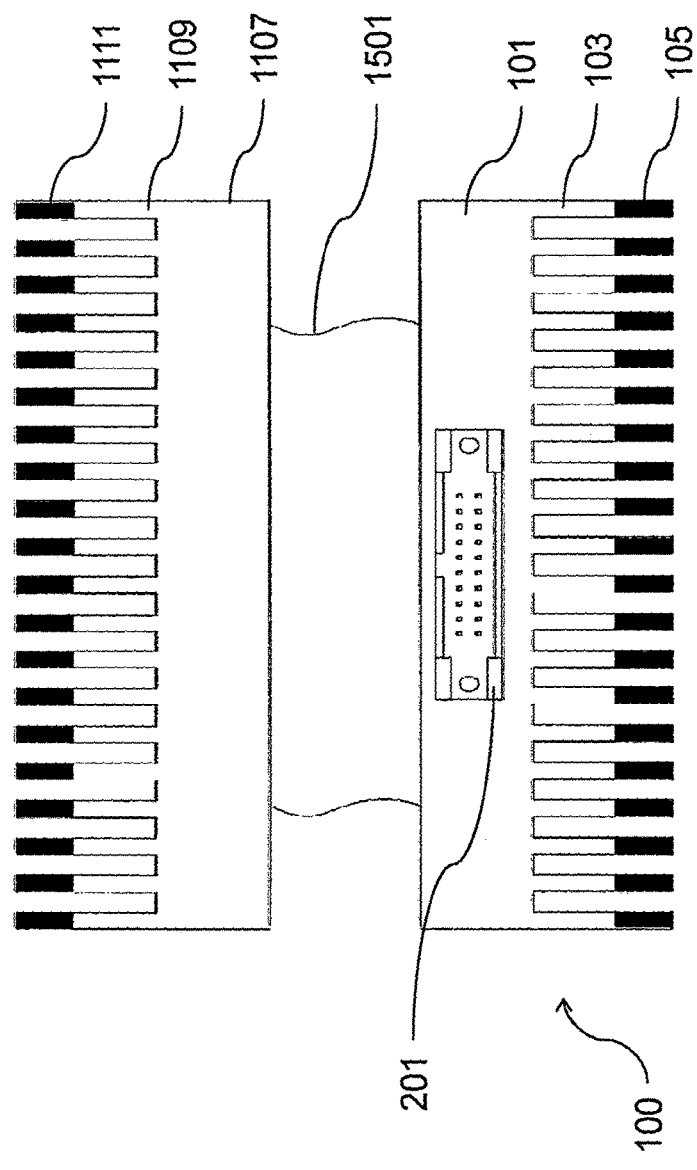
FIG. 15 is a schematic representation of the connecting adapter according to a further example.

FIG. 15 shows a schematic representation of the connecting adapter 100 according to a further example. The connecting adapter 100 comprises the printed circuit board 101, the further printed circuit board 1107 and a flexible printed circuit board portion 1501 which mechanically and electrically connects the printed circuit board 101 and the further printed circuit board 1107. The printed circuit board 101 further comprises comb teeth 103 comprising electrical contact surfaces 105. The plug connector 201 is furthermore arranged on the printed circuit board 101. The further printed circuit board 1107 further comprises comb teeth 1109 having electrical contact surfaces 1111. The flexible printed circuit board portion 1501 can furthermore electrically connect the not shown electrical signal transmission interface 1101 of the printed circuit board 101 and the not shown further electrical signal transmission interface 1113 of the further printed circuit board 1107. The flexible printed circuit board portion 1501 can comprise conductive paths for that purpose. Furthermore, the flexible printed circuit board portion 1501 enables compensating for lateral misalignment and/or height differences between individual levels of a multi-level connecting terminal assembly 500.

Figure 16:
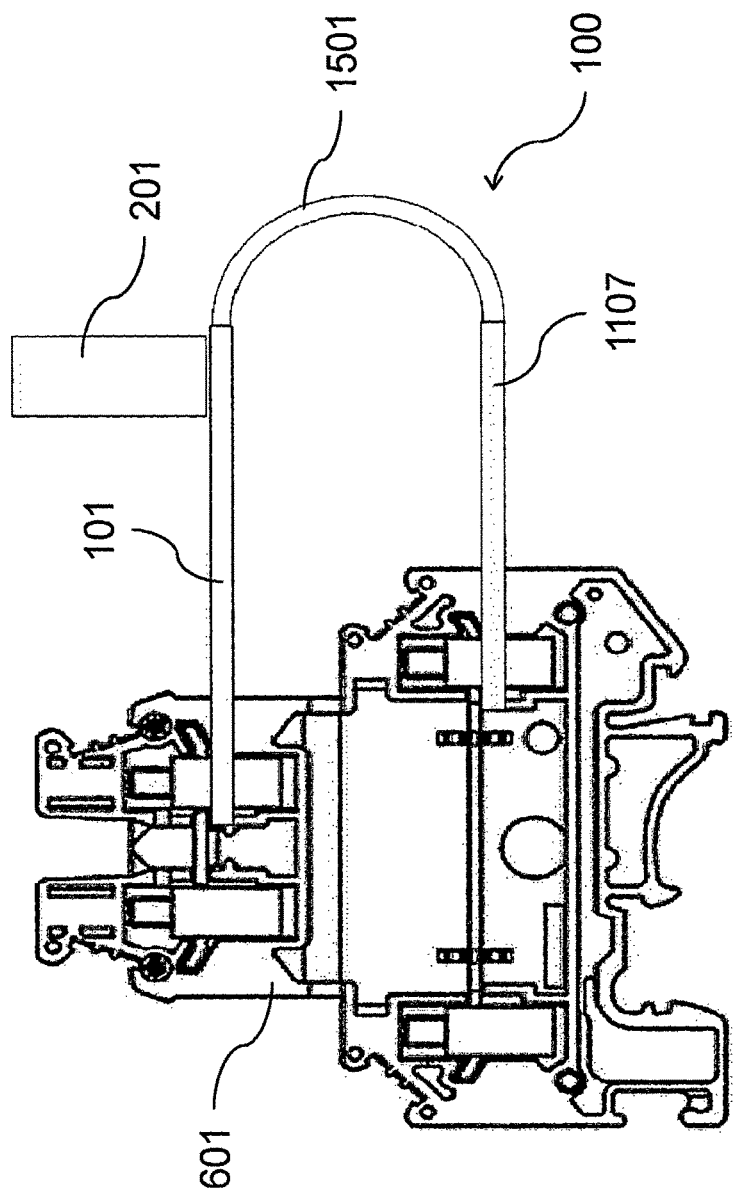
FIG. 16 is a cross-sectional view of an arrangement comprising the double-level terminal block shown in FIG. 6 and the connecting adapter according to the example shown in FIG. 15.

FIG. 16 shows a cross-sectional view of an arrangement having the double-level terminal block 601 shown in FIG. 6 and the connecting adapter 100 according to the example shown in FIG. 15. The connecting adapter 100 comprises printed circuit board 101, on which the plug connector 201 is arranged, the flexible printed circuit board portion 1501 and the further printed circuit board 1107. The connecting adapter 100 is connected to the double-level terminal block 601.

Figure 17:
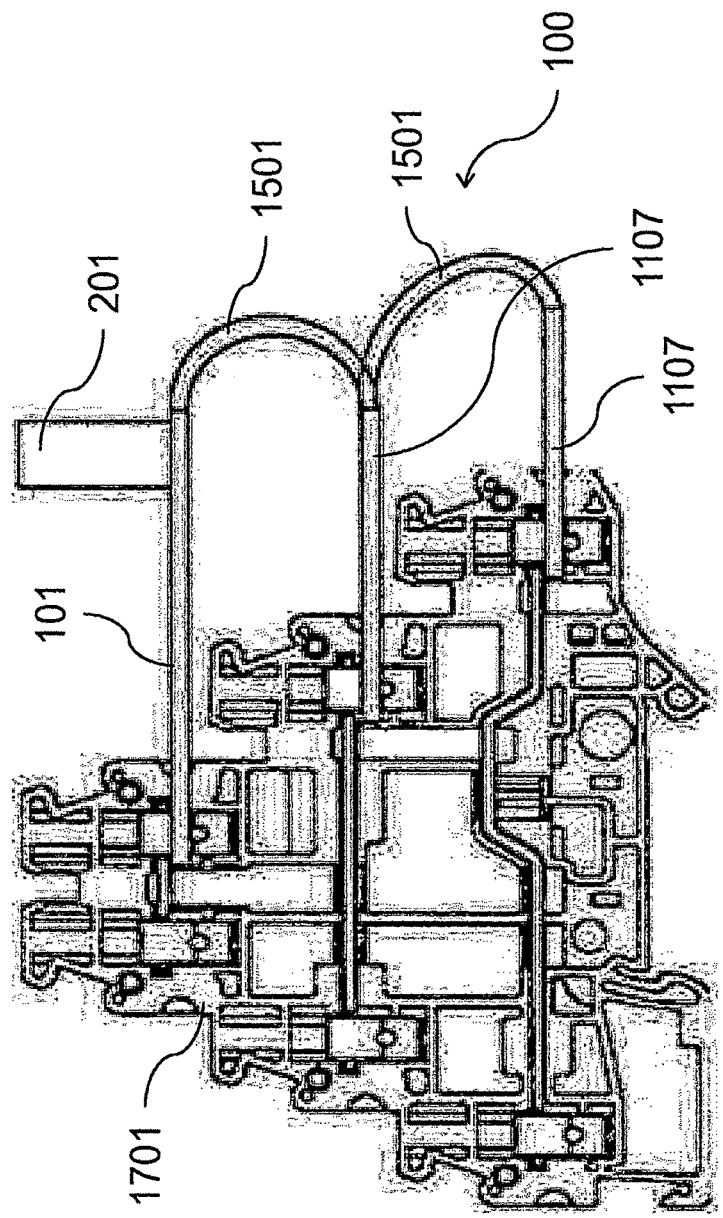
FIG. 17 is a cross-sectional view of an arrangement comprising a three-level terminal block and the connecting adapter according to a further example.

FIG. 17 shows a cross-sectional view of an arrangement having a three-level terminal block 1701 and the connecting adapter 100 according to a further example. The connecting adapter 100 comprises the printed circuit board 101, on which the plug connector 201 is arranged, two flexible printed circuit board portions 1501 and two further printed circuit boards 1107. The connecting adapter 100 is furthermore connected to the three-level terminal block 1701.

In accordance with one example, two flexible printed circuit board portions 1501 can be mechanically and electrically connected to a further printed circuit board 1107. To this end, one respective flexible printed circuit board portion 1501 can be laminated from above and one respective flexible printed circuit board portion 1501 can be laminated from below to the further printed circuit board 1107.

Figure 18:
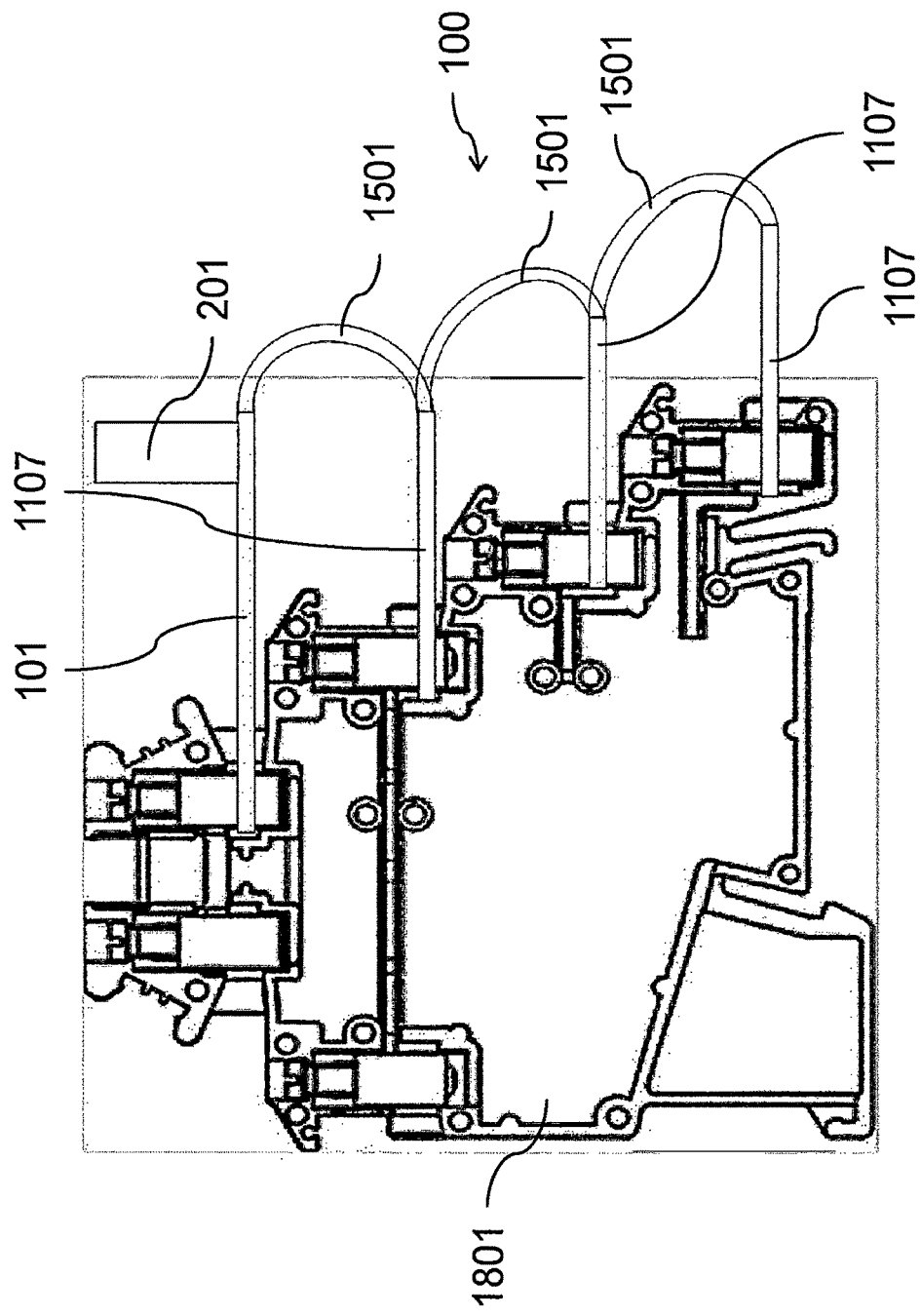
FIG. 18 is a cross-sectional view of an arrangement comprising a four-level terminal block and the connecting adapter according to a further example.

FIG. 18 shows a cross-sectional view of an arrangement having a four-level terminal block 1801 and the connecting adapter 100 according to a further example. The connecting adapter 100 comprises printed circuit board 101, on which the plug connector 201 is arranged, three flexible printed circuit board portions 1501 and three further printed circuit boards 1107. The connecting adapter 100 is furthermore connected to the four-level terminal block 1701.

All of the features described and shown in connection with individual examples of the disclosure can be provided in different combinations in the inventive subject matter so as to realize their advantageous effects simultaneously.

LIST OF REFERENCE NUMBERS

100 connecting adapter
101 printed circuit board
103 comb tooth
105 electrical contact surface
107 electrical plug connector interface
109 electrical terminal
111 opening
113 labeling field
115 identification field
117 drill hole
201 plug connector
203 electrical terminal
401 drill hole
500 connecting terminal assembly
501 terminal blocks
503 electrical connecting terminal
601 double-level terminal block
603 screw
901 electroconductive bar
1101 electrical signal transmission interface
1103 electrical terminal
1105 opening
1107 further printed circuit board
1109 comb tooth
1111 contact surface
1113 further signal transmission interface
1115 electrical terminal
1201 sandwich strip
1203 spacer pin
1501 flexible printed circuit board portion
1701 three-level terminal block
1901 four-level terminal block

What is claimed is:

1. A connecting adapter configured to connect to a connecting terminal assembly, wherein the connecting terminal assembly comprises a plurality of electrical connecting terminals, the connecting adapter comprising:
    a first printed circuit board comprising a first comb-type conducting structure comprising a plurality of comb teeth, wherein each comb tooth comprises a first electrical contact surface;
    a second printed circuit board comprising a second comb-type conducting structure comprising a plurality of comb teeth, wherein each comb tooth comprises a second electrical contact surface;
    an electrical plug connector interface configured to receive a plug connector, wherein the electrical plug connector interface comprises electrical terminals electrically connected to the first electrical contact surfaces of the comb teeth, and wherein the electrical plug connector interface is arranged on the first printed circuit board;
    a first electrical signal transmission interface formed in or on the first printed circuit board, wherein the first electrical signal transmission interface is electrically connected to the electrical plug connector interface; and
    a second electrical signal transmission interface formed in or on the second printed circuit board, wherein the second signal transmission interface is electrically connected to the first electrical signal transmission interface of the first printed circuit board and to the second electrical contact surfaces of the comb teeth of the second printed circuit board.

2. The connecting adapter according to claim 1, wherein the first electrical contact surface of at least one of the comb teeth is electrically connected to a respective electrical terminal of the electrical plug connector interface.

3. The connecting adapter according to claim 1, comprising the plug connector wherein the plug connector is electrically connected to the electrical terminals of the electrical plug connector interface.

4. The connecting adapter according to claim 3, wherein the plug connector is non-positively or positively connected to the first printed circuit board.

5. The connecting adapter according to claim 1, wherein the comb teeth of the first printed circuit board are rectangular or rounded.

6. The connecting adapter according to claim 1, wherein adjacent comb teeth of the first printed circuit board are spaced apart by means of a recess.

7. The connecting adapter according to claim 1, wherein the first electrical contact surface of a comb tooth of the plurality of comb teeth of the first printed circuit board comprises a rectangular, square, circular, triangular or pentagonal shape.

8. The connecting adapter according to claim 1, wherein the second electrical signal transmission interface is electrically connected to the first electrical signal transmission interface by a sandwich strip or a flexible printed circuit board portion.

9. The connecting adapter according to claim 1, wherein the second electrical contact surface of each comb tooth of the second printed circuit board is electrically connected to a respective electrical terminal of the electrical plug connector interface.

10. The connecting adapter according to claim 1, wherein the first printed circuit board and the second printed circuit board are arranged one above the other and at a spacing from one another.

11. The connecting adapter according to claim 10, wherein the first printed circuit board and the second printed circuit board are arranged at a spacing from one another by means of a spacer pin.

12. The connecting adapter according to claim 1, further comprising:
a plurality of printed circuit boards, wherein each printed circuit board comprises a third comb-type conducting structure comprising a plurality of comb teeth, each comprising a third electrical contact surface and a third electrical signal transmission interface, and wherein the third electrical contact surfaces of at least one printed circuit board of the plurality of printed circuit boards are connected to the third electrical signal transmission interface of the at least one printed circuit board.

13. The connecting adapter according to claim 12, wherein the third electrical contact surface of each comb tooth of the plurality of printed circuit boards is electrically connected to the electrical terminals of the electrical plug connector interface.

14. The plug connector according to claim 3, wherein the plug connector comprises an FLK plug connector or a D-Sub plug connector.

15. The recess according to claim 6, wherein the recess comprises a rectangular or rounded recess configured to receive a housing crosspiece of the connecting terminal assembly between adjacent electrical connecting terminals.

16. The flexible printed circuit board portion according to claim 8, wherein the flexible printed circuit board portion comprises a curved or S-shaped flexible printed circuit board portion.

17. The connecting adapter according to claim 1, further comprising at least one drill hole on the first printed circuit board.

18. The connecting adapter according to claim 1, wherein one or more of the first, second, or third electrical contact surfaces comprise a copper coating.

\* \* \* \* \*

UNITED STATES PATENT AND TRADEMARK OFFICE
CERTIFICATE OF CORRECTION

PATENT NO. : 10,193,287 B2
APPLICATION NO. : 15/532023
DATED : January 29, 2019
INVENTOR(S) : Schaper et al.

It is certified that error appears in the above-identified patent and that said Letters Patent is hereby corrected as shown below:

On the Title Page

At item (73) Assignee:
Delete "Phoenix Contact GmbH Co. KG" and
Insert --Phoenix Contact GmbH & Co. KG--.

Signed and Sealed this
Twenty-fourth Day of March, 2020

Andrei Iancu
*Director of the United States Patent and Trademark Office*